(12) United States Patent
Hara et al.

(10) Patent No.: US 9,202,728 B2
(45) Date of Patent: Dec. 1, 2015

(54) SUBSTRATE MOUNTING MECHANISM, AND SUBSTRATE PROCESSING APPARATUS

(75) Inventors: Masamichi Hara, Nirasaki (JP); Atsushi Gomi, Nirasaki (JP); Shinji Maekawa, Nirasaki (JP); Satoshi Taga, Nirasaki (JP); Kaoru Yamamoto, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 820 days.

(21) Appl. No.: 13/452,488

(22) Filed: Apr. 20, 2012

(65) Prior Publication Data

US 2012/0199573 A1   Aug. 9, 2012

Related U.S. Application Data

(60) Division of application No. 12/722,193, filed on Mar. 11, 2010, now abandoned, which is a continuation of application No. PCT/JP2008/065874, filed on Sep. 3, 2008.

(30) Foreign Application Priority Data

Sep. 11, 2007 (JP) ................................ 2007-234852
Aug. 26, 2008 (JP) ................................ 2008-216970

(51) Int. Cl.
*C23C 16/458* (2006.01)
*H01L 21/67* (2006.01)
*C23C 16/52* (2006.01)

(52) U.S. Cl.
CPC ...... *H01L 21/67103* (2013.01); *C23C 16/4586* (2013.01); *C23C 16/52* (2013.01); *H01L 21/67109* (2013.01)

(58) Field of Classification Search
USPC ................ 118/724, 725; 156/345.51, 345.52, 345.53
See application file for complete search history.

(56) References Cited

U.S. PATENT DOCUMENTS 5,676,205 A   10/1997   White
5,811,762 A   9/1998   Tseng
(Continued)

FOREIGN PATENT DOCUMENTS

JP   3-215670     9/1991
JP   10-326788    12/1998
(Continued)

OTHER PUBLICATIONS

Office Action issued Aug. 10, 2011, in Chinese Patent Application No. 200880106639.0 (with English translation).
(Continued)

*Primary Examiner* — Maureen Passey
(74) *Attorney, Agent, or Firm* — Oblon, McClelland, Maier & Neustadt, L.L.P.

(57) ABSTRACT

A substrate mounting mechanism on which a target substrate is placed is provided. The substrate mounting mechanism includes a heater plate, which has a substrate mounting surface on which the target substrate is placed and has a heater embedded therein to heat the substrate to a deposition temperature at which a film is deposited. The substrate mounting mechanism also includes a temperature control jacket, which is formed to cover at least a surface of the heater plate other than the substrate mounting surface and adjusts the temperature to a non-deposition temperature below the deposition temperature.

10 Claims, 11 Drawing Sheets

(56) References Cited

U.S. PATENT DOCUMENTS

| | | |
|---|---|---|
| 5,954,887 A | 9/1999 | Hatano |
| 5,968,273 A | 10/1999 | Kadomura et al. |
| 6,310,755 B1 * | 10/2001 | Kholodenko et al. ........ 361/234 |
| 2004/0226515 A1 * | 11/2004 | Yendler et al. ................ 118/728 |

FOREIGN PATENT DOCUMENTS

| | | |
|---|---|---|
| JP | 11-16858 | 1/1999 |
| JP | 11-176919 | 7/1999 |
| JP | 2001-160479 | 6/2001 |
| JP | 2003-338492 | 11/2003 |
| JP | 2006-339637 | 12/2006 |
| JP | 2007-51317 | 3/2007 |
| KR | 10-0269579 | 10/1997 |

OTHER PUBLICATIONS

Korean Office Action issued Jul. 27, 2012, in Korea Patent Application No. 10-2010-7005339.

* cited by examiner

COMPARATIVE EXAMPLE

COMPARATIVE EXAMPLE

SUBSTRATE MOUNTING MECHANISM, AND SUBSTRATE PROCESSING APPARATUS

This application is a divisional application of pending U.S. application Ser. No. 12/722,193, filed on Mar. 11, 2010, the entire contents of which is incorporated herein by reference. U.S. application Ser. No. 12/722,193 is a continuation application of PCT International Application No. PCT/JP2008/065874 filed on Sep. 3, 2008 (which designated the United States) which claims priority to JP 2007-234852 filed on Sep. 11, 2007 and JP 2008-216970 filed on Aug. 26, 2008.

FIELD OF THE INVENTION

The present invention relates to a substrate mounting mechanism having a heater to heat a target substrate such as a semiconductor wafer mounted thereon in a processing chamber of a substrate processing apparatus such as a film forming apparatus, a substrate processing apparatus including the substrate mounting mechanism, a method for suppressing film deposition on the substrate mounting mechanism, and a storage medium.

BACKGROUND OF THE INVENTION

As one of manufacturing processes of semiconductor devices, there is a CVD film forming process that is performed on a semiconductor wafer serving as a target substrate. In this process, the semiconductor wafer serving as a target substrate is heated to a specific temperature generally by using a heater plate (stage heater) also serving as a substrate mounting table. A general heater plate is disclosed in Japanese Patent Application Publication No. H10-326788.

It is ideal that a film is deposited only on the semiconductor wafer in the CVD film forming process. However, actually, a film is deposited on the heater plate which heats the semiconductor wafer, as well. That is because the heater plate has a deposition temperature or more. The film deposited on the heater plate is influenced by the rise and fall of the temperature of the chamber or the heater and repeatedly thermally expanded and contracted. Accordingly, a thermal stress is accumulated in the deposited film. Ultimately, the film is peeled off to generate particles. The generation of particles in the chamber may cause deterioration in production yield of the semiconductor devices.

SUMMARY OF THE INVENTION

It is an object of the present invention to provide a substrate mounting mechanism capable of suppressing film deposition, a substrate processing apparatus including the substrate mounting mechanism, a method for suppressing film deposition on the substrate mounting mechanism, and a storage medium storing a program for operating the substrate processing apparatus including the substrate mounting mechanism.

In accordance with a first aspect of the present invention, there is provided a substrate mounting mechanism including a heater plate having a substrate mounting surface on which a target substrate is placed and a heater embedded therein to heat the target substrate to a deposition temperature at which a film is deposited; and a temperature control jacket formed to cover at least a surface of the heater plate other than the substrate mounting surface and having a non-deposition temperature below the deposition temperature.

In accordance with a second aspect of the present invention, there is provided a substrate processing apparatus including a substrate mounting mechanism which includes a heater plate having a substrate mounting surface on which a target substrate is placed and a heater embedded therein to heat the target substrate to a deposition temperature at which a film is deposited and a temperature control jacket formed to cover at least a surface of the heater plate other than the substrate mounting surface and having a non-deposition temperature below the deposition temperature; a chamber accommodating the substrate mounting mechanism; and a film forming section for performing a film forming process on the target substrate.

In accordance with a third aspect of the present invention, there is provided a method for suppressing film deposition on a substrate mounting mechanism, which includes a heater plate having a substrate mounting surface on which a target substrate is placed and a heater embedded therein to heat the target substrate to a deposition temperature at which a film is deposited, the method including providing a temperature control jacket to cover at least a surface of the heater plate other than the substrate mounting surface; heating the substrate mounting surface of the heater plate to the deposition temperature at which a film is deposited, by the heater embedded in the heater plate; and adjusting a temperature of the temperature control jacket to a non-deposition temperature below the deposition temperature.

In accordance with a fourth aspect of the present invention, there is provided a storage medium storing a program which runs on a computer and, when executed, controls a substrate processing apparatus which includes a heater plate having a heater embedded therein to heat a target substrate to a deposition temperature at which a film is deposited, and a temperature control jacket formed to cover at least a surface of the heater plate other than a substrate mounting surface of the heater plate and having a temperature control unit, to perform a method for suppressing film deposition. The method for suppressing film deposition includes heating the substrate mounting surface of the heater plate to the deposition temperature at which a film is deposited by the heater embedded in the heater plate; and adjusting a temperature of the temperature control jacket to a non-deposition temperature below the deposition temperature.

DETAILED DESCRIPTION OF THE EMBODIMENTS

Hereinafter, embodiments of the present invention will be described in more detail with reference to accompanying drawings which form a part hereof.

First Embodiment

Figure 1:
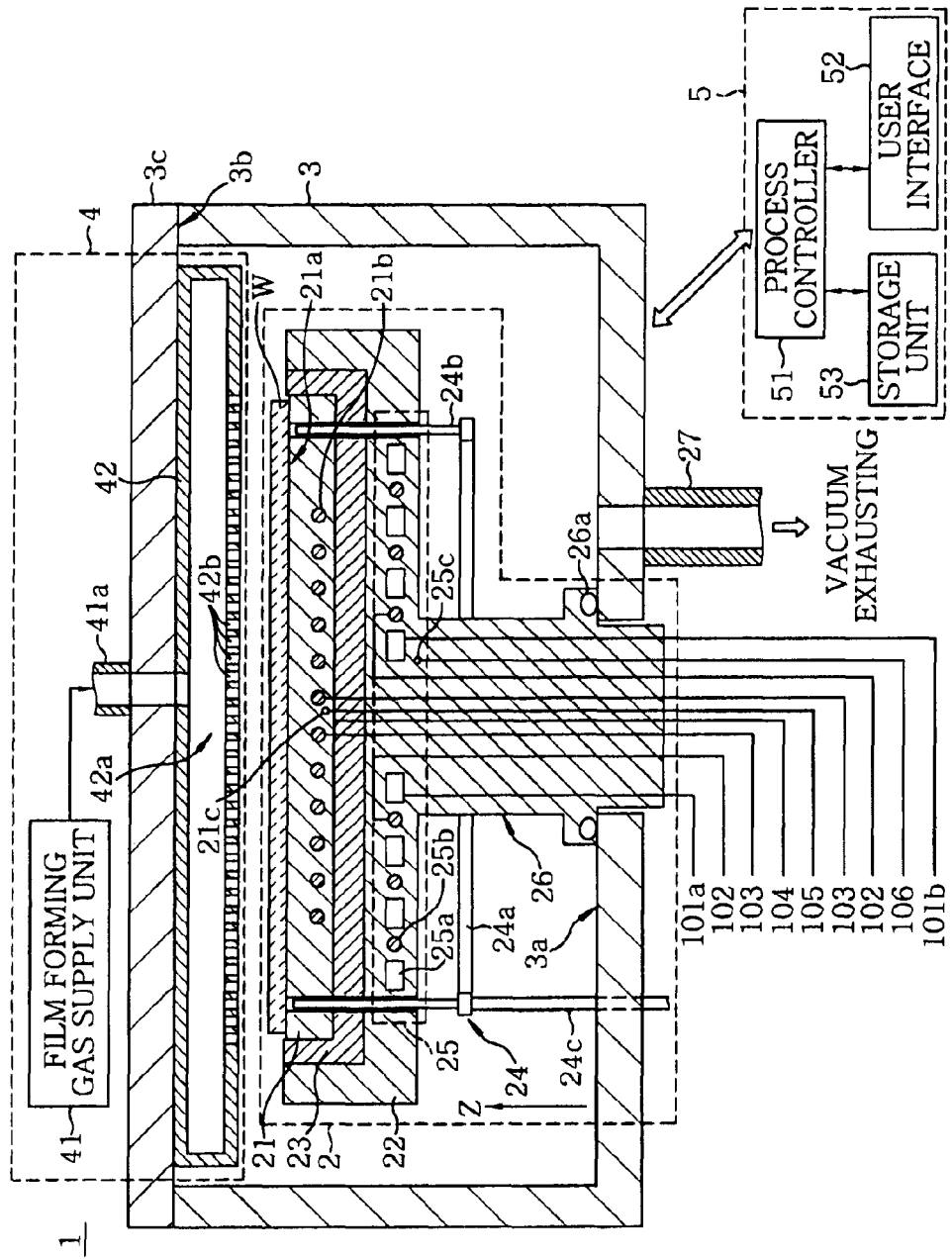
FIG. 1 is a cross sectional view schematically showing an example of a substrate processing apparatus in accordance with a first embodiment of the present invention.

FIG. 1 is a cross sectional view schematically showing an example of a substrate processing apparatus in accordance with a first embodiment of the present invention.

As shown in FIG. 1, the substrate processing apparatus of the first embodiment is a CVD apparatus 1 for performing, e.g., a film forming process on a target substrate (in this embodiment, a semiconductor wafer) W. The CVD apparatus 1 includes a substrate mounting mechanism 2, a chamber 3 accommodating the substrate mounting mechanism 2, a film forming section 4 for performing a film forming process on a target substrate (in this embodiment, a semiconductor wafer) W, and a control section 5 for controlling the CVD apparatus 1.

The substrate mounting mechanism 2 includes a heater plate 21, a temperature control jacket 22, a thermal insulator 23 and a substrate lift mechanism 24.

The heater plate 21 has a substrate mounting surface 21a on which the target substrate is placed. A heater (hereinafter, referred to as a "heater electrode") 21b for heating the target substrate W is embedded in the heater plate 21. The heater electrode 21b heats a temperature of the target substrate W to, e.g., a deposition temperature at which a film is deposited. The target substrate W is in contact with only the heater plate 21. In the present embodiment, the heater electrode 21b is a heating resistor enclosed in the heater plate 21. The heater plate 21 may be made of metal or ceramics. The metal may include aluminum or an aluminum alloy, and the ceramics may include aluminum nitride. In the present embodiment, the heater plate 21 is made of aluminum, particularly, pure aluminum, e.g., aluminum with, e.g., 99.00% purity or more.

The temperature control jacket 22 is provided to cover at least a surface of the heater plate 21 other than the substrate mounting surface 21a. A temperature control unit 25 is embedded in the temperature control jacket 22. The temperature control unit 25 adjusts the temperature of the temperature control jacket 22 to become a non-deposition temperature below the deposition temperature in the film forming process. The temperature control unit 25 includes a temperature control fluid circulating mechanism 25a for adjusting (increasing or decreasing) the temperature of the temperature control jacket 22 and a heater 25b for heating the temperature of the temperature control jacket 22.

The temperature control fluid circulating mechanism 25a uses cooling water as a temperature control fluid. A water cooling pipe for circulating the cooling water is enclosed in the temperature control jacket 22. The heater (heater electrode) 25b also has a heating resistor enclosed in the temperature control jacket 22. In the present embodiment, the water cooling pipe and the heating resistor are alternately arranged.

Further, only one of the temperature control fluid circulating mechanism 25a and the heater 25b may be provided as the temperature control unit 25. The temperature control jacket 22 may be made of metal or ceramics. The metal may include aluminum or an aluminum alloy, and the ceramics may include aluminum nitride. In the present embodiment, the temperature control jacket 22 is made of aluminum, particularly, an aluminum alloy. The aluminum alloy may include an Al—Mg aluminum alloy or Al—Mg—Si aluminum alloy having excellent processability and high strength compared to pure aluminum.

As described above, the temperature control jacket 22 is formed of an aluminum alloy, and the heater plate 21 is formed of an aluminum alloy having less elements than the temperature control jacket 22 or pure aluminum substantially without dopants or impurities. By this configuration, it is possible to prevent metal contamination on the target substrate W and to provide the temperature control jacket 22 having, e.g., appropriate processability and strength.

The heater plate 21 and the temperature control jacket 22 are fixed at an upper end of a support member 26. A lower end of the support member 26 is fixed at a bottom portion 3a of the chamber 3. Further, a seal member 26a is interposed to seal between the support member 26 and the bottom portion bottom portion 3a.

A cooling water supply line 101a, a cooling water discharge line 101b, a heater electrode line 102 of the temperature control jacket 22, a heater electrode line 103 of the heater plate 21, a gas purge line 104, a thermocouple line 105 for temperature control of the heater plate 21, a thermocouple line 106 for temperature control of the temperature control jacket 22 and the like are provided to pass through the inside of the support member 26.

The cooling water supply line 101a supplies cooling water for the temperature control jacket to the temperature control fluid circulating mechanism 25a. The cooling water discharge line 101b exhausts the cooling water from the temperature control fluid circulating mechanism 25a.

The heater electrode line 102 supplies a power to the heater electrode 25b of the temperature control jacket 22. In the same way, the heater electrode line 103 supplies a power to the heater electrode 21b of the heater plate 21.

The thermocouple lines 105 and 106 are connected to thermocouples 21c and 25c provided in the heater plate 21 and the temperature control jacket 22, respectively. These thermocouples 21c and 25c are used for temperature control of the heater plate 21 and the temperature control jacket 22.

Further, the gas purge line 104 will be described in the following embodiment.

Figure 2:
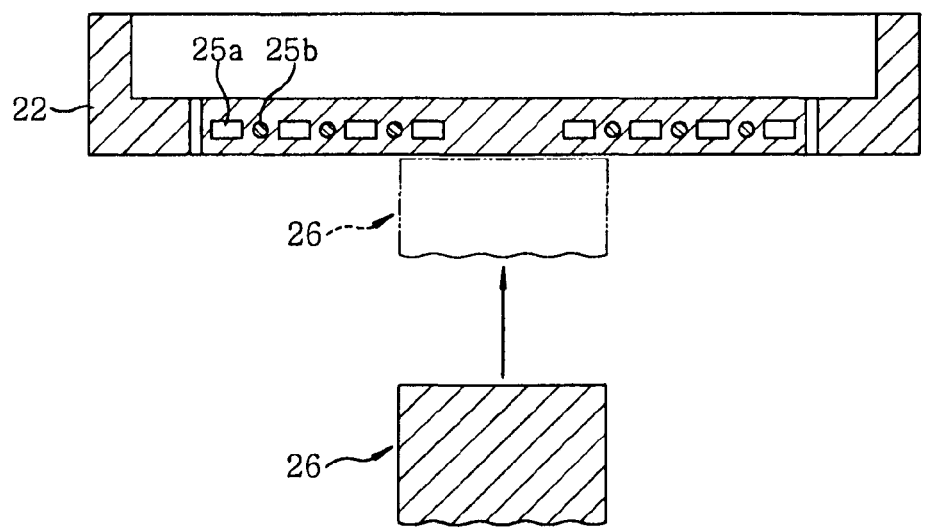
FIG. 2 is a cross sectional view showing a modification example of a temperature control jacket.

Although the support member 26 and the temperature control jacket 22 formed as a single body are illustrated in FIG. 1, the support member 26 and the temperature control jacket 22 may be formed separately as shown in FIG. 2.

Figure 3:
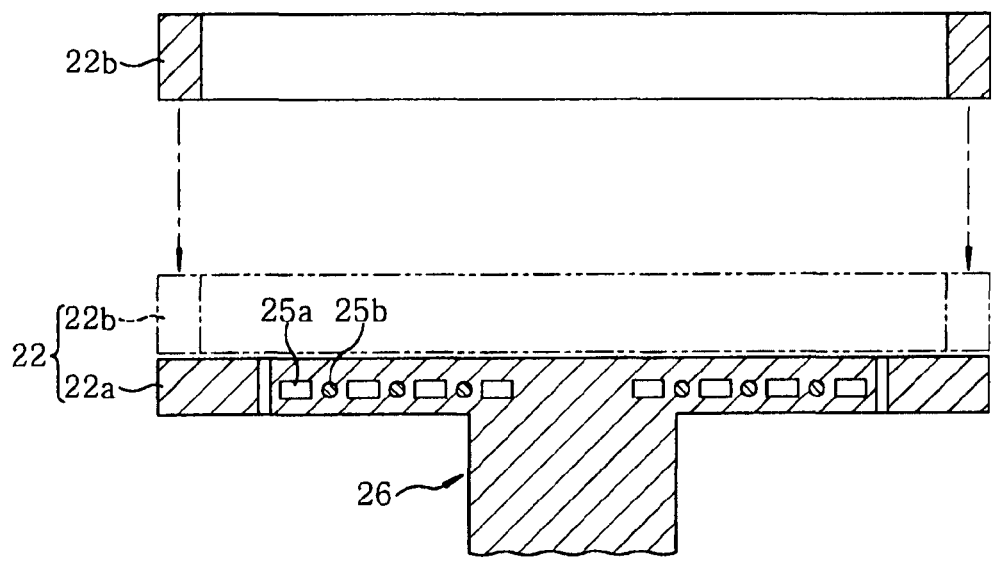
FIG. 3 is a cross sectional view showing a modification example of the temperature control jacket.

Further, the temperature control jacket 22 itself may be formed as a single member, but may be formed as separate members. As an example of the separate members, as shown in FIG. 3, the temperature control jacket 22 may include a disc-shaped bottom plate 22a for covering a bottom portion of the heater plate 21 and a ring-shaped sidewall 22b for covering a side portion of the heater plate 21.

Figure 4:
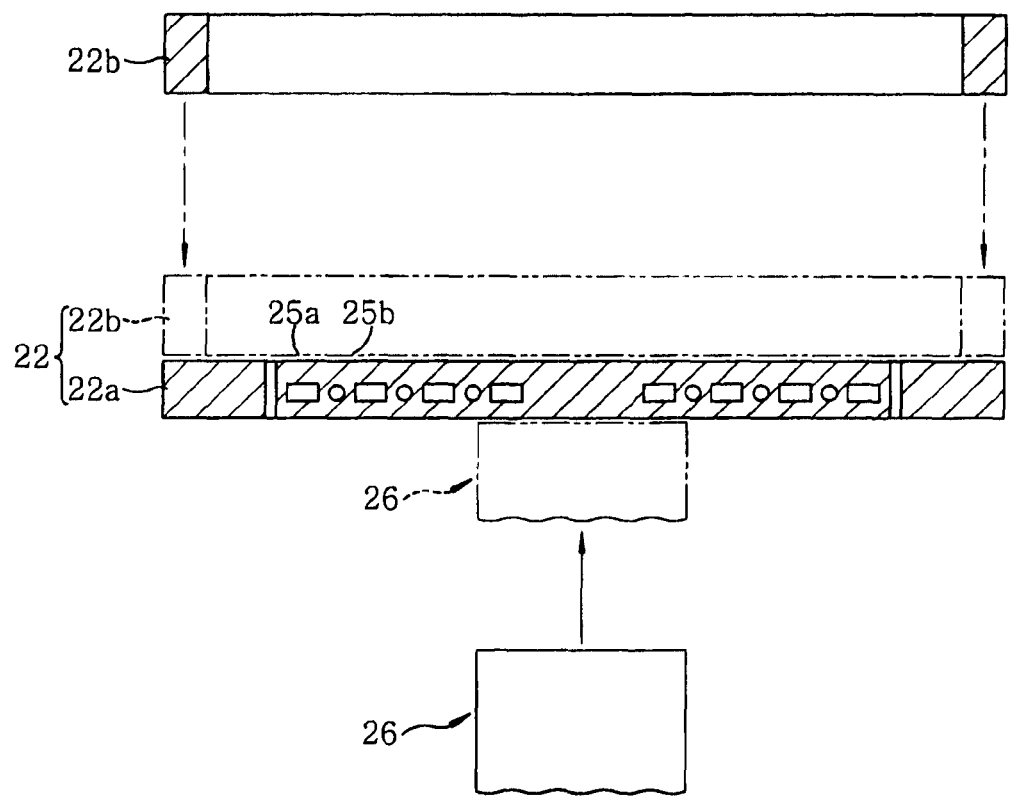
FIG. 4 is a cross sectional view showing a modification example of the temperature control jacket.

As shown in FIG. 4, the support member 26 and the temperature control jacket 22 may be formed separately, and, further, the temperature control jacket 22 may be formed as separate members of the bottom plate 22a and the sidewall 22b.

As described above, when the support member 26 and the temperature control jacket 22 are formed separately or the temperature control jacket 22 is formed as separate members, the temperature control jacket 22 can be formed without complicated machining processes, and the manufacturing cost of the temperature control jacket 22 can be reduced.

In the first embodiment, the thermal insulator 23 is interposed between the heater plate 21 and the temperature control jacket 22. The thermal insulator 23 suppresses heat transfer between the heater plate 21 and the temperature control jacket 22. Accordingly, the heater plate 21 is hardly influenced by the temperature of the temperature control jacket 22 and, similarly, the temperature control jacket 22 is hardly influenced by the temperature of the heater plate 21. Further, temperature control, e.g., temperature uniformity control, of the heater plate 21 and the temperature control jacket 22 can be more accurately performed.

The thermal insulator 23 may be made of a material having lower thermal conductivity than materials of which the heater plate 21 and the temperature control jacket 22 are made, e.g., metal, ceramics or quartz. The metal may include, e.g., stainless steel (SUS) and the ceramics may include, e.g., alumina. In the present embodiment, the thermal insulator 23 is made of stainless steel.

Figure 5:
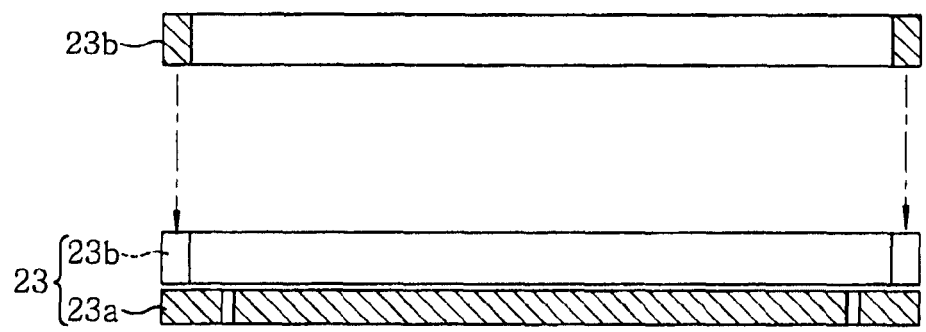
FIG. 5 is a cross sectional view showing a modification example of a thermal insulator.

In the same manner as the temperature control jacket 22, the thermal insulator 23 may be formed as a single member or separate members. As an example of the separate members, as shown in FIG. 5, the thermal insulator 23 may include a disc-shaped bottom plate 23a for covering a bottom portion of the heater plate 21 and a ring-shaped sidewall 23b for covering a side portion of the heater plate 21 in the same way as the temperature control jacket 22.

As described above, when the thermal insulator 23 is formed as separate members, the thermal insulator 23 can be formed without complicated machining processes and, thus, the manufacturing cost of the thermal insulator 23 can be reduced.

The substrate lift mechanism 24 has a lifter arm 24a, lift pins 24b attached to the lifter arm 24a, and a shaft 24c for vertically moving the lifter arm 24a. The lift pins 24b are inserted into lift pin insertion holes formed in the temperature control jacket 22, the thermal insulator 23 and the heater plate 21. When the shaft 24c is driven in a Z direction to lift up the target substrate W, the lifter arm 24a is moved up and the lift pins 24b attached to the lifter arm 24a press the backside of the target substrate W to lift up the target substrate W from the substrate mounting surface 21a.

Reversely, when the shaft 24c is driven to lower the target substrate W, the lifter arm 24a is moved down and, accordingly, the lift pins 24b are separated from the backside of the target substrate W and the target substrate W is mounted on the substrate mounting surface 21a.

The chamber 3 accommodates the substrate mounting mechanism 2. The bottom portion 3a of the chamber 3 to which the support member 26 is fixed as described above is connected to a gas exhaust pipe 27. The gas exhaust pipe 27 is connected to a vacuum exhaust device (not shown) and, accordingly, the chamber 3 can be vacuum evacuated if necessary. An upper lid 3c is provided to an upper portion 3b of the chamber 3.

The film forming section 4 includes a film forming gas supply unit 41 and a shower head 42.

The film forming gas supply unit 41 supplies a specific film forming gas into the chamber 3 via a film forming gas supply pipe 41a. The film forming gas supply pipe 41a is connected to a diffusion space 42a of the shower head 42. The shower head 42 is attached to the upper lid 3c and a plurality of gas discharge holes 42b are formed at a surface of the shower head 42 facing the target substrate W. The film forming gas diffused in the diffusion space 42a is discharged into the chamber 3 through the gas discharge holes 42b. When the discharged film forming gas is supplied to the target substrate W having a deposition temperature, a film is formed on the surface of the target substrate W.

The control section 5 includes a process controller having a micro processor (computer) and a user interface 52 having a keyboard through which an operator inputs commands to manage the CVD apparatus 1, a display for displaying an operation status of the substrate processing apparatus, or the like. The control section 5 further includes a storage unit 53 for storing therein a control program for allowing the process controller 51 to implement various processes performed in the CVD apparatus 1 and/or a program (i.e., a recipe) for executing processes in the CVD apparatus 1 in accordance with various data and process conditions.

Further, the recipe is stored in a storage medium of the storage unit 53. The storage medium may be a hard disk, or a portable storage medium, such as a CD-ROM, a DVD, or a flash memory. Further, the recipe may be appropriately transmitted from another apparatus via, e.g., a dedicated line. If necessary, a certain recipe may be retrieved from the storage unit 53 in accordance with an instruction inputted through the user interface 52 and implemented by the process controller 51 such that a desired process is performed in the CVD apparatus 1 under control of the process controller 51.

Further, in the present embodiment, the recipe includes a temperature control program for controlling the temperatures of the heater plate 21 and the temperature control jacket 22. The temperature control program is stored in the storage medium. For example, in the film forming process, the control section 5 heats the heater electrode 21b of the heater plate 21 to increase a temperature of the target substrate W to a deposition temperature at which film deposition is performed, and also controls the temperature control unit 25 such that the temperature control jacket 22 has a non-deposition temperature below the deposition temperature.

Figure 6:
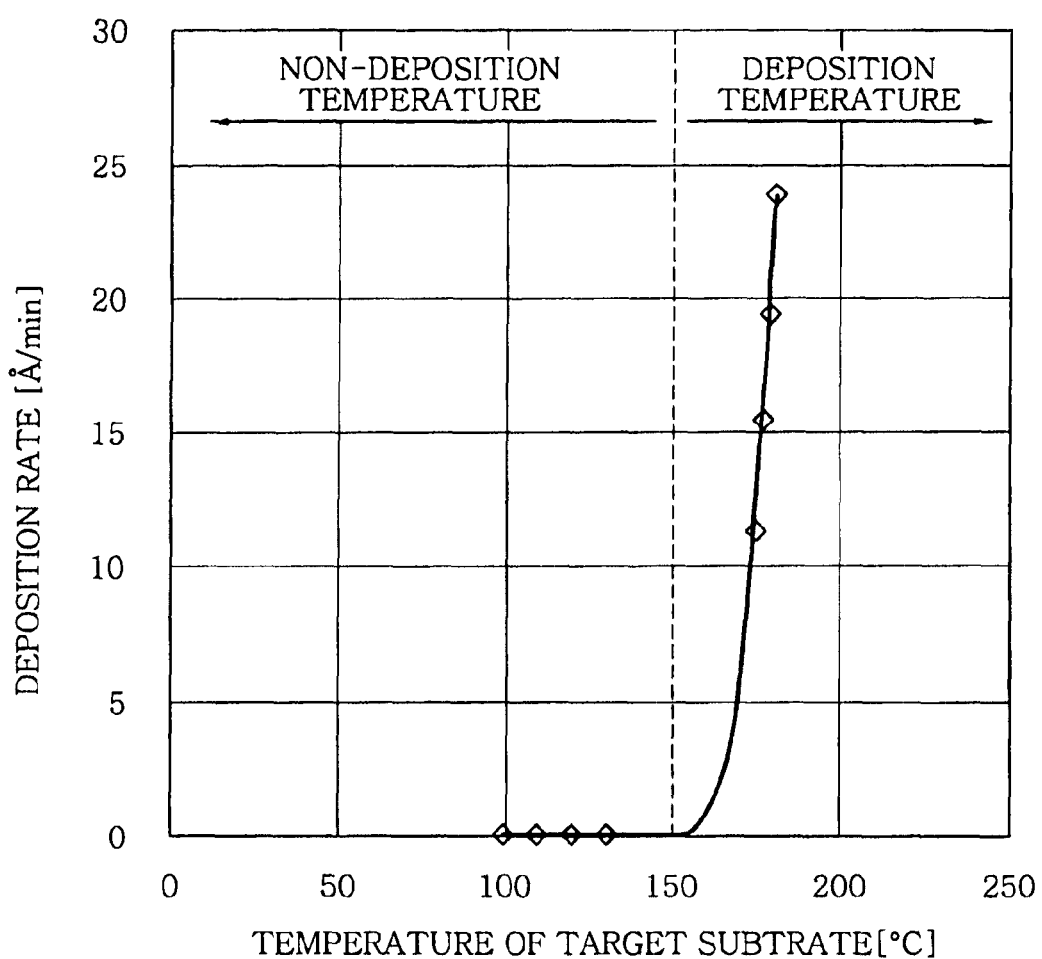
FIG. 6 illustrates a relationship between a temperature of a target substrate and a deposition rate.

FIG. 6 illustrates a relationship between the temperature of the target substrate and the deposition rate. In an example of FIG. 6, ruthenium (Ru) is deposited by using a CVD method.

As shown in FIG. 6, ruthenium starts to be deposited when the temperature of the target substrate W reaches about 150° C. Ruthenium is rarely deposited at a temperature below 150° C., particularly, 120° C. or less. That is, a deposition temperature of ruthenium is 150° C. or more, and a non-deposition temperature of ruthenium is below 150° C. In this example, the temperature control is performed such that ruthenium is deposited on the target substrate W while preventing ruthenium from being deposited on a portion other than the target substrate W by using the relationship between the temperature and the deposition rate.

For example, in the film forming process, the heater electrode 21b of the heater plate 21 is controlled such that the target substrate W has a deposition temperature of 150° C. or more at which ruthenium is deposited, and the temperature control unit 25 is controlled such that the temperature control jacket 22 has a non-deposition temperature below 150° C.

Further, in the example of FIG. 6, $Ru_3(CO)_{12}$ (ruthenium complex compound) was used as a source gas of ruthenium. The film forming process is thermal decomposition of $Ru_3(CO)_{12}$, wherein Ru and Co are separated by thermal decomposition and a Ru film is formed on the target substrate W.

In accordance with the CVD apparatus 1 of the first embodiment, the heater electrode 21b of the heater plate 21 is set to have a deposition temperature, and the temperature control jacket 22 that covers at least a surface of the heater plate 21 other than the substrate mounting surface 21a is set to have a non-deposition temperature. Accordingly, a film can be deposited on the target substrate W mounted on the substrate mounting surface 21a while preventing a film from being deposited on a portion other than the target substrate W. Therefore, it is possible to reduce generation of particles and to improve quality of semiconductor devices and production yield.

Figure 7A:
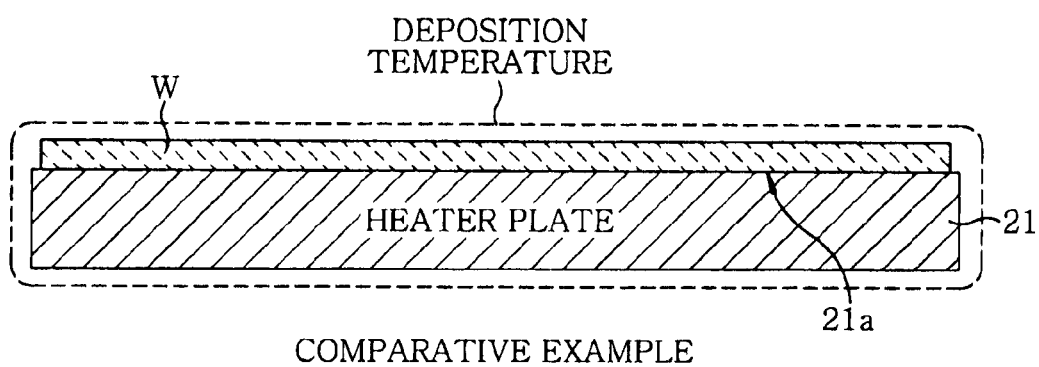
FIG. 7A is a cross sectional view showing a comparative example.
Figure 7B:
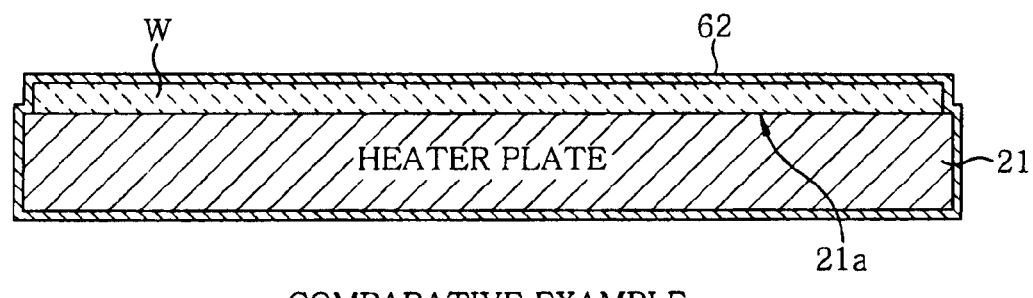
FIG. 7B is a cross sectional view showing another comparative example.

A comparative example is shown in FIGS. 7A and 7B.

As shown in FIG. 7A, when the temperature control jacket 22 is not provided, substantially the entire surface of the heater plate 21 is heated to a deposition temperature. Consequently, as shown in FIG. 7B, a film 62 is deposited on substantially the entire surface of the heater plate 21 as well as the target substrate W.

Figure 8A:
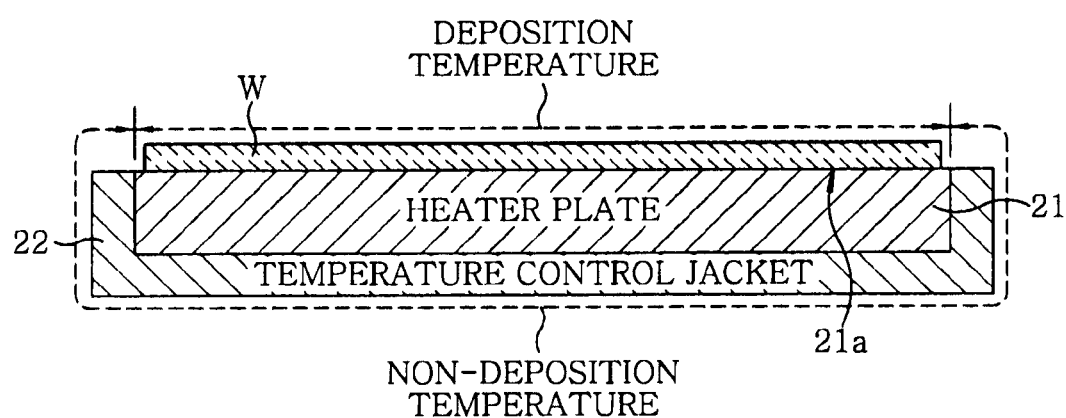
FIG. 8A is a cross sectional view showing the embodiment.
Figure 8B:
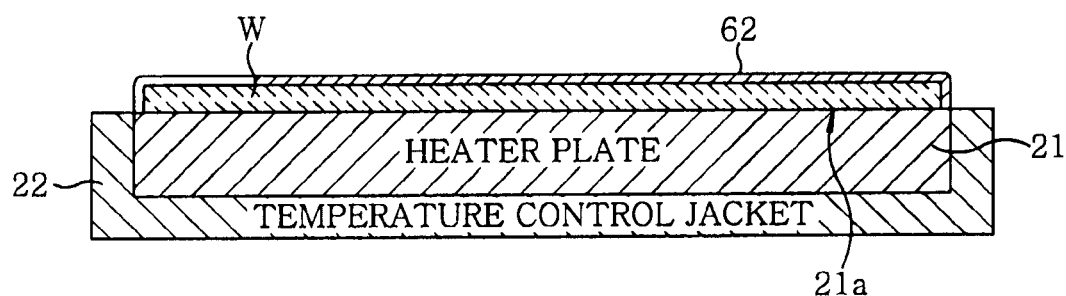
FIG. 8B is a cross sectional view showing the embodiment.

With the CVD apparatus 1 in accordance with the first embodiment, however, since the temperature control jacket 22 is provided to cover at least a surface of the heater plate 21 other than the substrate mounting surface 21a, as shown in FIG. 8A, only the substrate mounting surface 21a can be set to have a deposition temperature and a portion covered with the temperature control jacket 22 can be set to have a non-deposition temperature. As a result, as shown in FIG. 8B, the film 62 can be selectively deposited only on the target substrate W. Since the film 62 is not deposited on the temperature control jacket 22, it is possible to remove a cause of particles in the chamber 3.

Further, with the CVD apparatus 1 of the first embodiment, the film can be deposited only on the target substrate W and, thus, the number of cleaning operations performed in the chamber 3 can be reduced. For example, no cleaning operation may be performed.

By reducing the number of cleaning operations performed in the chamber 3, time required for operations other than film formation, e.g., cleaning and maintenance, in the CVD apparatus 1 can be decreased, thereby enhancing throughput in the manufacture of the semiconductor devices.

Second Embodiment

Figure 9:
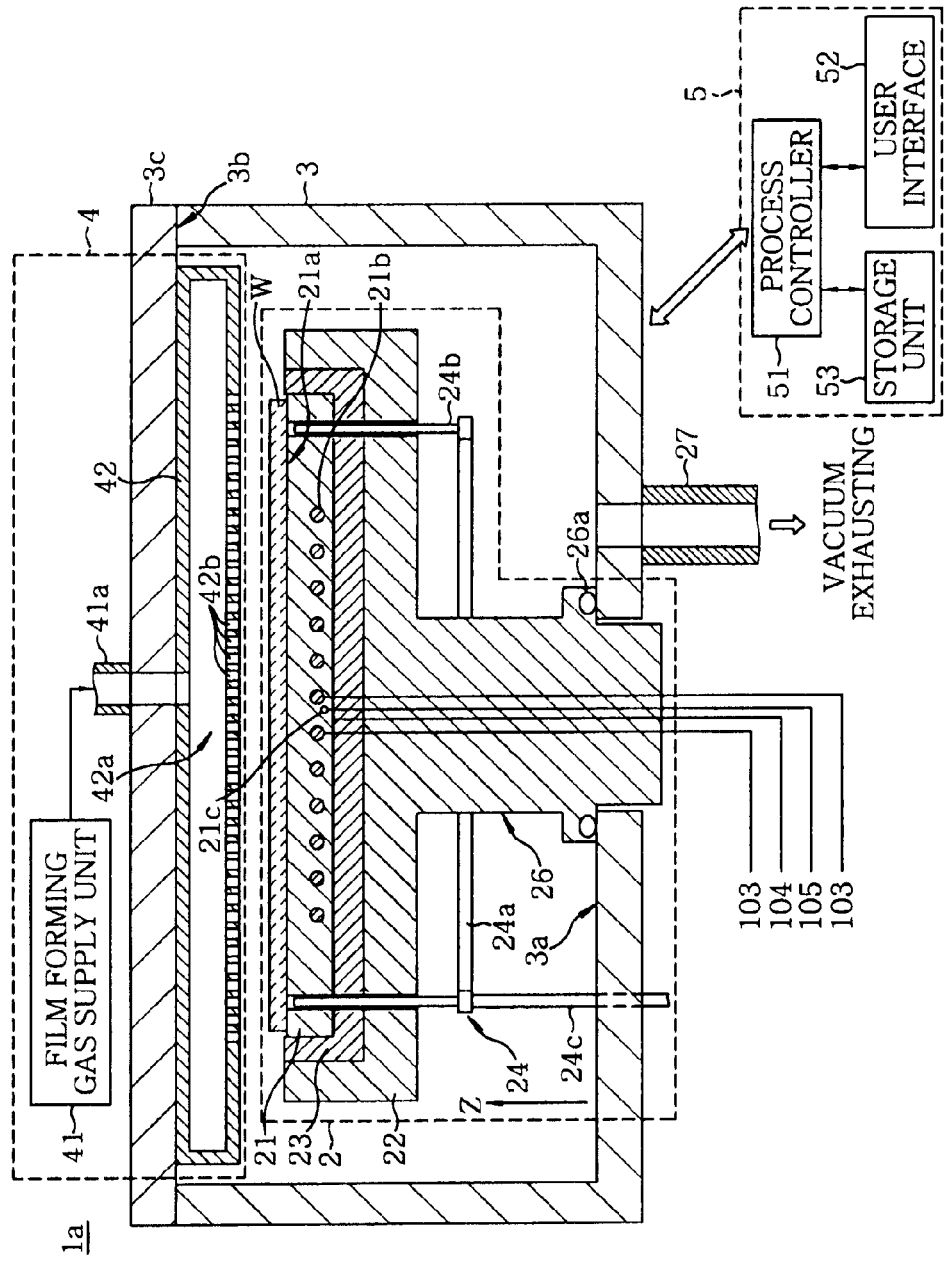
FIG. 9 is a cross sectional view schematically showing an example of a substrate processing apparatus in accordance with a second embodiment of the present invention.

FIG. 9 is a cross sectional view schematically showing an example of a substrate processing apparatus in accordance with a second embodiment of the present invention. In FIG. 9, the same reference numerals are given to the same components as those in FIG. 1, and only different features will be described.

As shown in FIG. 9, a CVD apparatus 1a of the second embodiment is different from the CVD apparatus 1 of the first embodiment in that the temperature control unit 25 is omitted from the temperature control jacket 22.

The thermal insulator 23 is interposed between the heater plate 21 and the temperature control jacket 22. The thermal insulator 23 suppresses heat transfer from the heater plate 21 to the temperature control jacket 22. Accordingly, even though the temperature control jacket 22 itself is not thermally controlled, the temperature of the temperature control jacket 22 can be set to have a non-deposition temperature lower than the temperature of the heater plate 21, i.e., a deposition temperature. Thus, the temperature control unit 25 may be omitted.

In the second embodiment, the temperature of the temperature control jacket 22 can be set to a non-deposition temperature without the temperature control unit 25, thereby preventing film deposition on the temperature control jacket 22. Thus, the same effect as that of the first embodiment can be obtained.

That is, as described in the second embodiment, the temperature of the temperature control jacket 22 can be set to be a non-deposition temperature by using only the thermal insulator 23 without the temperature control unit 25.

Third Embodiment

Figure 10:
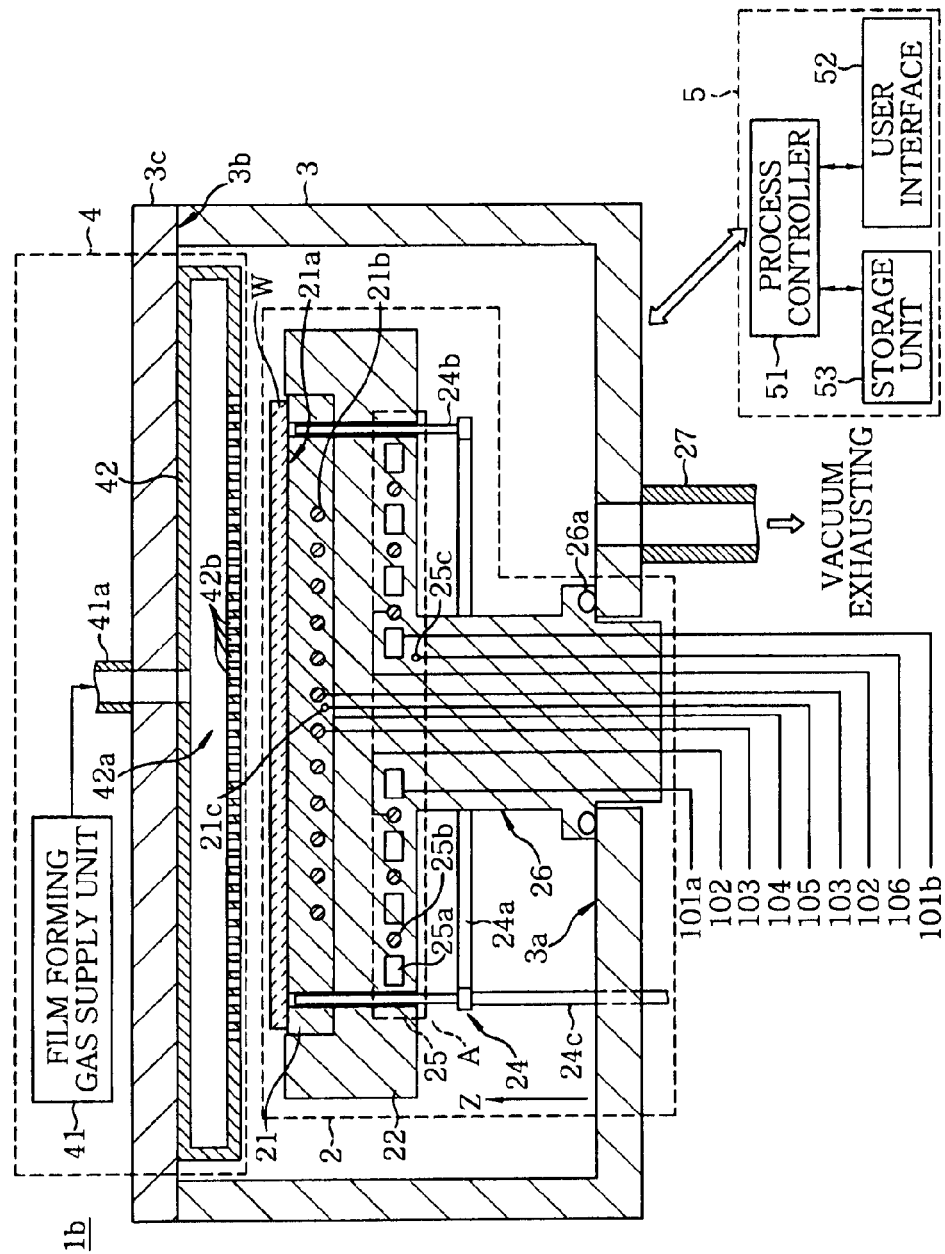
FIG. 10 is a cross sectional view schematically showing an example of a substrate processing apparatus in accordance with a third embodiment of the present invention.

FIG. 10 is a cross sectional view schematically showing an example of a substrate processing apparatus in accordance with a third embodiment of the present invention. In FIG. 10, the same reference numerals is given to the same components as those in FIG. 1, and only different features will be described.

As shown in FIG. 10, a CVD apparatus 1b of the third embodiment is different from the CVD apparatus 1 of the first embodiment in that the thermal insulator 23 is omitted between the heater plate 21 and the temperature control jacket 22.

The temperature control jacket 22 of the CVD apparatus 1b has the temperature control unit 25 as in the first embodiment. If the temperature control jacket 22 has the temperature control unit 25 as such, the temperature of the temperature control jacket 22 can be adjusted to a non-deposition temperature without the thermal insulator 23. Accordingly, the thermal insulator 23 may be omitted.

In the third embodiment, the temperature of the temperature control jacket 22 can be set to a non-deposition temperature without the thermal insulator 23, thereby preventing film deposition on the temperature control jacket 22. Thus, the same effect as that of the first embodiment can be obtained.

As in the third embodiment, the temperature of the temperature control jacket 22 can be set to a non-deposition temperature by using only the temperature control unit 25 without the thermal insulator 23.

Further, the temperature control jacket 22 itself may be made of a thermal insulator. Also in this case, the thermal insulator 23 may be omitted.

Further, when the temperature control jacket 22 itself is made of a thermal insulator, the temperature control jacket 22 can suppress heat transfer from the heater plate 21. Accordingly, the temperature control unit 25 may be omitted as in the second embodiment.

Fourth Embodiment

Figure 11:
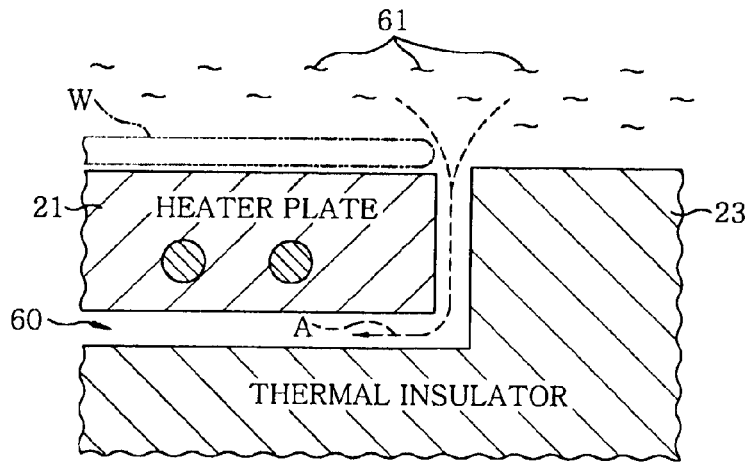
FIG. 11 is an enlarged cross sectional view showing a joint portion between a heater plate and a thermal insulator.
Figure 12:
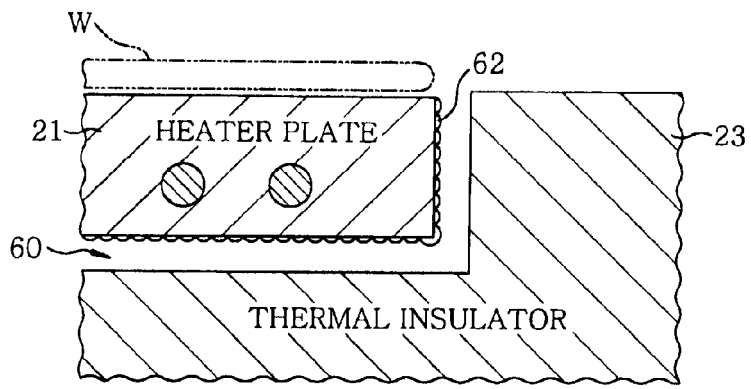
FIG. 12 is an enlarged cross sectional view showing the joint portion between the heater plate and the thermal insulator.
Figure 13:
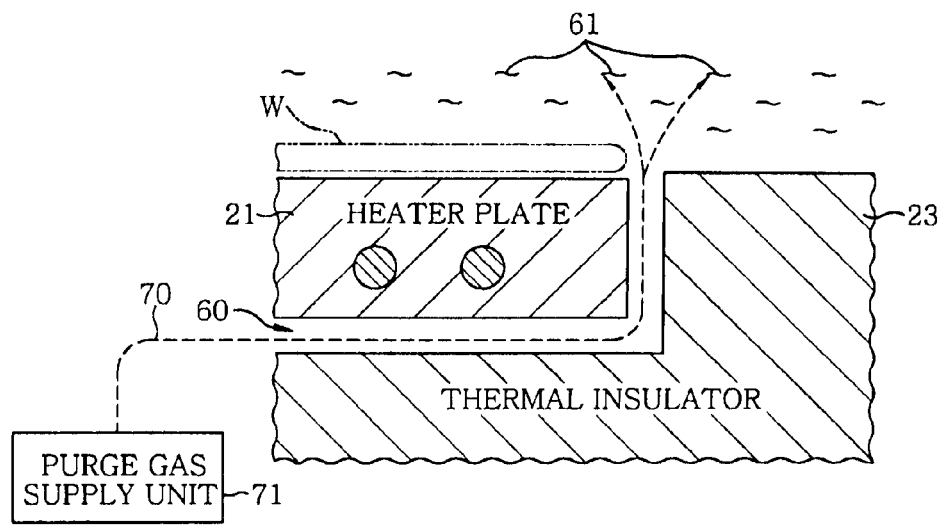
FIG. 13 is an enlarged cross sectional view showing the joint portion between the heater plate and the thermal insulator in a substrate processing apparatus in accordance with a fourth embodiment of the present invention.

FIGS. 11 to 13 are enlarged cross sectional views showing a joint portion between the heater plate 21 and the thermal insulator 23.

Although the heater plate 21 and the thermal insulator 23 are jointed to each other, there is a microscopically small gap 60 between the heater plate 21 and the thermal insulator 23, as shown in FIG. 11. During the film forming process, the film forming gas 61 is introduced into the gap 60 as indicated by an arrow A.

Since the heater plate 21 is at the deposition temperature, when the film forming gas is in contact with the heater plate 21, the film is deposited on the heater plate 21. FIG. 12 illustrates a state in which the film 62 is deposited on the heater plate 21 by the film forming gas 61 introduced into the gap 60. The film 62 deposited on a portion of the heater plate 21 facing the gap 60 may cause generation of particles.

In the fourth embodiment, a purge gas supply unit 71 supplies a purge gas 70 to the gap 60 between the heater plate 21 and the thermal insulator 23 and the purge gas 70 passes through the gap 60 and is discharged therefrom, as shown in FIG. 13. Further, a supply path of the purge gas 70 is represented as the "gas purge line 104" in FIGS. 1, 9 and 10.

The film forming gas 61 is difficult to enter the gap 60 by making the purge gas 70 flow through the gap 60. As a result, it is possible to prevent the film 62 from being deposited on the portion of the heater plate 21 facing the gap 60.

In an example of FIG. 13, although the purge gas 70 flows in the gap 60 between the heater plate 21 and the thermal insulator 23, when the thermal insulator 23 is not provided, e.g., as in the third embodiment, the purge gas 70 may flow through a gap between the heater plate 21 and the temperature control jacket 22 and be discharged therefrom.

Further, the purge gas 70 may be supplied if necessary.

Fifth Embodiment

Next, a fifth embodiment showing a more specific example will be described.

Figure 14:
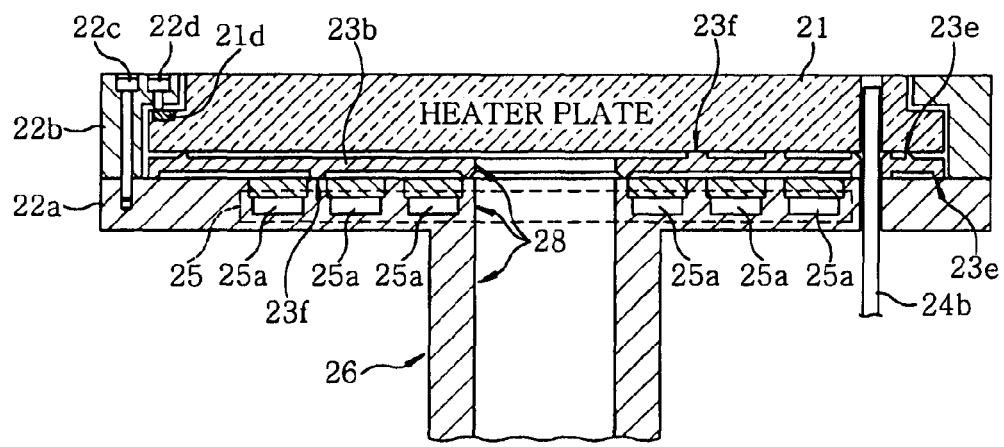
FIG. 14 is a cross sectional view schematically showing an example of a substrate mounting mechanism in accordance with a fifth embodiment of the present invention.
Figure 15:
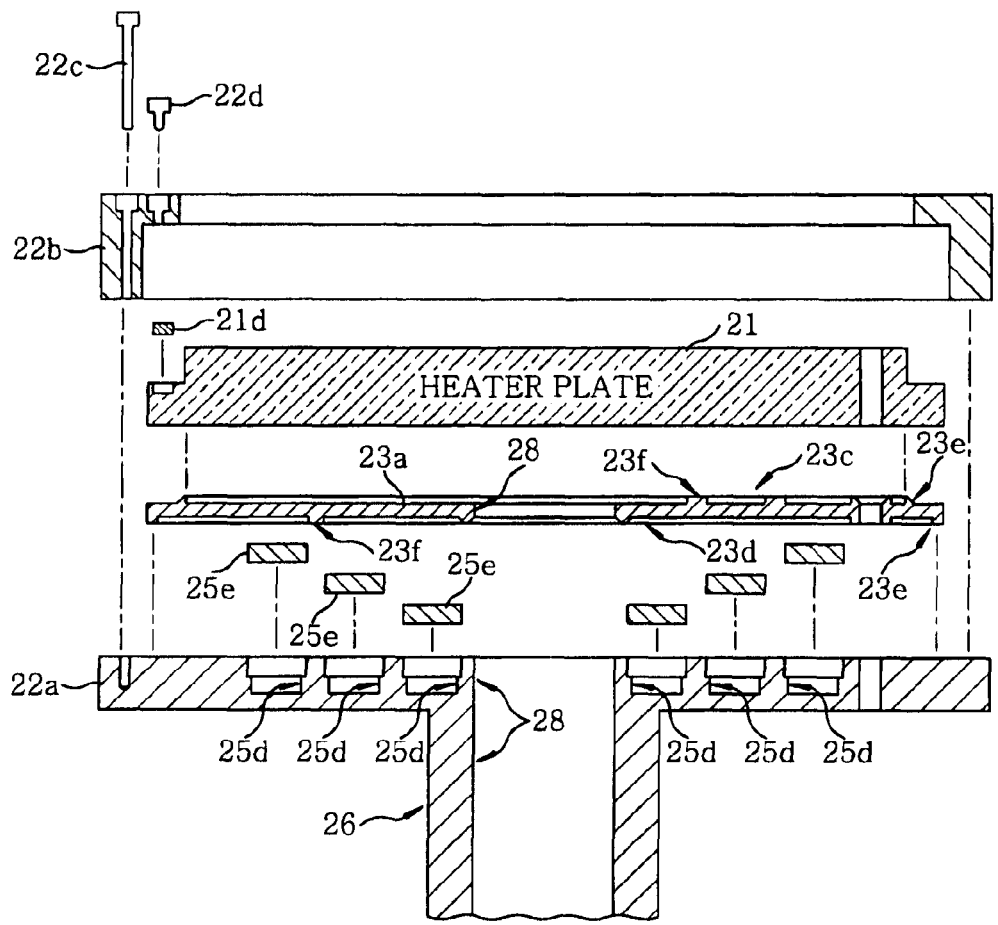
FIG. 15 is an exploded view of the substrate mounting mechanism shown in FIG. 14.

FIG. 14 is a cross sectional view schematically showing an example of a substrate mounting mechanism in accordance with the fifth embodiment of the present invention. FIG. 15 is an exploded view of the substrate mounting mechanism shown in FIG. 14. Further, in FIGS. 14 and 15, the substrate mounting mechanism is only illustrated and illustration of the other components, e.g., the chamber and the like is omitted.

As shown in FIGS. 14 and 15, in the fifth embodiment, the temperature control jacket 22 is divided into the bottom plate 22a and the sidewall 22b, and the thermal insulator 23 constituted only by the bottom plate 23a. The bottom plate 22a and the sidewall 22b are fixed to each other by, e.g., a bolt 22c. Further, the heater plate 21 is pressed against the sidewall 22b of the temperature control jacket 22 by a bolt 22d having a rounded leading end such that the heater plate 21 can slide in thermal expansion. A member 21d harder than the heater plate 21 is provided at a contact portion between the leading end of the bolt 22d to thereby prevent abrasion of the heater plate 21.

Further, provided in the bottom plate 22a is only the temperature control fluid circulating mechanism 25a for circulating a temperature control fluid as the temperature control unit 25 for controlling the temperature of the temperature control jacket 22 in the fifth embodiment. The temperature control fluid circulating mechanism 25a is obtained by forming a groove 25d in the bottom plate 22a and providing a covering member 25e to cover the groove 25d. The temperature control fluid flows through the groove 25d.

A hole 28 formed through the bottom plate 23a of the thermal insulator 23, the bottom plate 22a of the temperature control jacket 22 and the support member 26 allows a temperature control fluid line, a heater electrode line, a gas purge line, a thermocouple line and the like (all are not shown) to pass therethrough.

Figure 16:
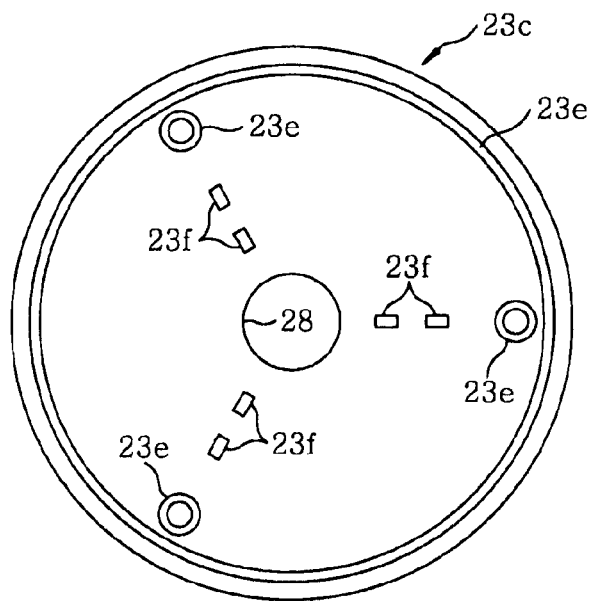
FIG. 16 is a plan view of a thermal insulator shown in FIG. 14.

Further, the thermal insulator 23 (the bottom plate 23a in this embodiment) has uneven structures on a surface 23c facing the heater plate 21 and a surface 23d facing the temperature control jacket 22 (the bottom plate 22a in this embodiment), respectively. The uneven structures include at least one of cylindrical protrusions 23e and rectangular protrusions 23f formed on at least one of the surfaces 23c and 23d. By forming the uneven structures on the surfaces 23c and 23d, the thermal insulator 23 (the bottom plate 23a in this embodiment) is partially in contact with the heater plate 21 and the temperature control jacket 22 (the bottom plate 22a in this embodiment), respectively. FIG. 16 is a plan view of the surface 23c of the bottom plate 23a facing the heater plate 21, and FIG. 17 is a plan view of the surface 23d facing the temperature control jacket 22.

Figure 17:
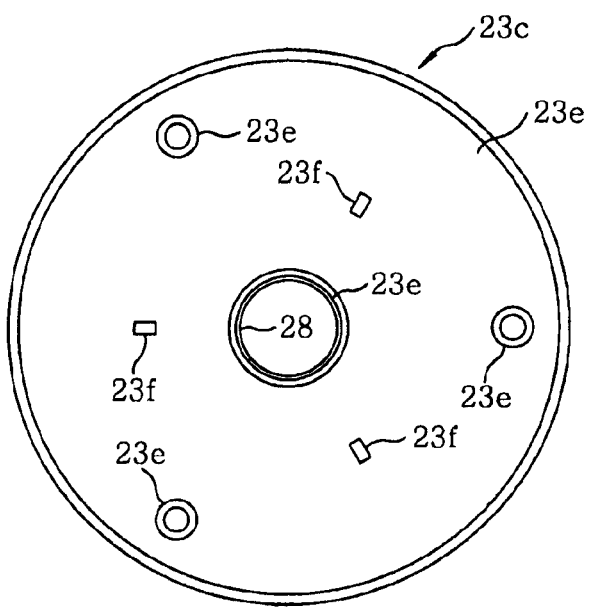
FIG. 17 is a plan view of the thermal insulator shown in FIG. 14.

As shown in FIGS. 16 and 17, in this embodiment, the cylindrical protrusions 23e are arranged in an outer periphery and an inner periphery (i.e., a periphery of the hole 28) of the bottom plate 23a and by the lift pin insertion holes adjacent to the outer periphery of the bottom plate 23a of the thermal insulator 23. Further, the rectangular protrusions 23f are arranged inwardly from the cylindrical protrusions 23e formed in the outer periphery and the vicinity of the outer periphery of the bottom plate 23a.

As described above, by bringing the thermal insulator 23 into partial contact with the heater plate 21 and the temperature control jacket 22, heat transfer from the heater plate 21 to the temperature control jacket 22 becomes more difficult. Accordingly, it is possible to more efficiently reduce the temperature of the temperature control jacket 22 to a non-deposition temperature.

Further, although the thermal insulator 23 is brought into partial contact with both the heater plate 21 and the temperature control jacket 22 in this embodiment, the thermal insulator 23 may be brought into partial contact with only any one of the heater plate 21 and the temperature control jacket 22.

Also in the fifth embodiment, the same effect as that of the above embodiments can be achieved.

While the invention has been shown and described with respect to the embodiments, various changes and modification may be made without being limited thereto.

For example, although the CVD apparatus was used in the above embodiments, the present invention may be also applied to any apparatus for film deposition, e.g., a plasma CVD apparatus and an ALD apparatus, without being limited thereto.

Further, although ruthenium was illustrated as a deposited film in the above embodiments, it is not limited thereto.

What is claimed is:

1. A substrate mounting mechanism comprising:
   a heater plate having a substrate mounting surface on which a target substrate is placed and a heater embedded therein to heat the target substrate to a deposition temperature at which a film is deposited;
   a temperature control jacket formed to cover at least a surface of the heater plate other than the substrate mounting surface and having a non-deposition temperature below the deposition temperature, the temperature control jacket including a temperature control unit and having a disc-shaped bottom plate covering a bottom portion of the heater plate and a ring-shaped sidewall covering a side portion of the heater plate; and
   a thermal insulator provided between the heater plate and the disc-shaped bottom plate,
   wherein the thermal insulator has uneven structures including a cylindrical protrusion and a rectangular protrusion on each of a surface facing the heater plate and a surface facing the temperature control jacket.

2. The substrate mounting mechanism of claim 1, wherein the temperature control unit has a temperature control fluid circulating mechanism for circulating a temperature control fluid to adjust a temperature of the temperature control jacket.

3. The substrate mounting mechanism of claim 1, wherein the temperature control jacket is formed of a thermal insulator.

4. The substrate mounting mechanism of claim 1, wherein the temperature control jacket is formed of an alloy, and the heater plate is formed of a pure metal or an alloy having less elements than the alloy forming the temperature control jacket.

5. The substrate mounting mechanism of claim 1, further comprising a purge gas supply unit configured to supply a purge gas between the heater plate and the ring-shaped sidewall, thereby preventing a film forming gas for forming a film on the target substrate from entering a gap between the heater plate and the ring-shaped sidewall.

6. A substrate processing apparatus comprising:
a substrate mounting mechanism which includes a heater plate having a substrate mounting surface on which a target substrate is placed and a heater embedded therein to heat the target substrate to a deposition temperature at which a film is deposited; a temperature control jacket formed to cover at least a surface of the heater plate other than the substrate mounting surface and having a non-deposition temperature below the deposition temperature, the temperature control jacket including a temperature control unit and having a disc-shaped bottom plate for covering a bottom portion of the heater plate and a ring-shaped sidewall for covering a side portion of the heater plate; and
a thermal insulator provided between the heater plate and the disc-shaped bottom plate;
a chamber accommodating the substrate mounting mechanism; and
a film forming section for performing a film forming process on the target substrate,
wherein the thermal insulator has uneven structures including a cylindrical protrusion and a rectangular protrusion on each of a surface facing the heater plate and a surface facing the temperature control jacket.

7. The substrate processing apparatus of claim 6, wherein the temperature control unit has a temperature control fluid circulating mechanism for circulating a temperature control fluid to adjust a temperature of the temperature control jacket.

8. The substrate processing apparatus of claim 6, wherein the temperature control jacket is formed by using a thermal insulator.

9. The substrate processing apparatus of claim 6, wherein the temperature control jacket is formed of an alloy, and the heater plate is formed of a pure metal or an alloy having less elements than the alloy forming the temperature control jacket.

10. The substrate processing apparatus of claim 6, further comprising a purge gas supply unit configured to supply a purge gas between the heater plate and the ring-shaped sidewall, thereby preventing a film forming gas for forming a film on the target substrate from entering a gap between the heater plate and the ring-shaped sidewall.

* * * * *